(12) United States Patent
Takeshita et al.

(10) Patent No.: US 6,469,259 B2
(45) Date of Patent: Oct. 22, 2002

(54) WIRING BOARD

(75) Inventors: Yoshihiro Takeshita; Shinya Terao; Satoru Takenouchi; Masaki Kaji, all of Kokubu; Ryuji Koga, Okayama, all of (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/795,765

(22) Filed: Feb. 27, 2001

(65) Prior Publication Data
US 2001/0050182 A1 Dec. 13, 2001

(30) Foreign Application Priority Data

Feb. 29, 2000 (JP) ........................................ 2000-053997
Apr. 28, 2000 (JP) ........................................ 2000-130989

(51) Int. Cl.[7] ............................................. H01R 12/04
(52) U.S. Cl. ..................... 174/261; 174/255; 174/202; 301/748; 301/760; 301/794
(58) Field of Search ............................... 174/261, 255, 174/260, 262; 361/794, 748, 777, 760, 803; 257/208

(56) References Cited

U.S. PATENT DOCUMENTS 5,110,664 A * 5/1992 Nakanishi et al. .......... 174/256
6,040,985 A * 3/2000 Arai et al. .................. 174/261
6,137,064 A * 10/2000 Kiani et al. ................. 174/261
6,181,571 B1 * 1/2001 Sugimoto .................... 361/803

FOREIGN PATENT DOCUMENTS

JP          9-266361          10/1997

* cited by examiner

*Primary Examiner*—Albert W. Paladini
(74) *Attorney, Agent, or Firm*—Hartson & Hartson, LLP

(57) ABSTRACT

A wiring board of the present invention readily controls a power source voltage and unwanted irradiation noises developed across a power source layer and a ground layer over a broad range of frequencies with a simple arrangement. The wiring board has an on-board surface on the surface of a dielectric substrate, on which a semiconductor device or the like is mounted, and a power source layer and a ground layer, which are made of a conductor material principally composed of at least one kind of element selected from Cu, W, and Mo, are provided on the back surface of the dielectric substrate or within the same. The periphery of at least one of low resistance areas of the power source layer and ground layer, respectively is provided with a corresponding high resistance area having a higher sheet resistance than that of the respective low resistance areas.

23 Claims, 11 Drawing Sheets

FIG. 4B

WIRING BOARD

This application is based on the applications No. 2000-053997 and No. 2000-130989 filed in Japan, the content of which is incorporated hereinto by reference.

BACKGROUND OF THE INVENTION

1. Field of the Invention

The present invention relates to an arrangement to control variance of voltage and unwanted radiation noises in a wiring board, on which a semiconductor device, such as an IC, an LSI, and a transistor, is mounted, and more particularly to a wiring board, on which a digital circuit is mounted.

A wiring board of the present invention is applicable to a semiconductor device encapsuling package for sealing a semiconductor device mounted on the surface of a wiring board airtight, a hybrid integrated wiring board, on which various electronic components including a capacitor and a resistor are mounted besides the semiconductor device, etc.

2. Description of the Related Art

In a wiring board forming a predetermined electronic circuit by having thereon mounted an electronic component, such as an IC, an LSI, and a transistor, a high frequency current is generated and flows between a power source terminal and a ground terminal during the operation of the electronic component. The high frequency current propagates across the electronic circuit, which triggers a malfunction of the circuit itself or causes unwanted radiation noises to be generated.

In particular, noticeable high frequency noises are generated at the power source and ground in the vicinity of a circuit that operates digitally, and when these noises propagate to the power source and ground in an area where a connection with a cable or the like is established, common-mode currents are produced in the cable, which give rise to strong radiation noises. Also, resonance generated depending on the shapes of the power source layer and ground layer or an interlayer capacity therebetween is the principal cause of variance of potential.

As a countermeasure against such inconveniences, a method is employed, in which the high frequency current is trapped by mounting a decoupling capacitor in the vicinity of the electronic component that becomes a noise source.

Also, Japanese Laid-open Patent Application No.9-266361 proposes to reduce the high frequency electromagnetic wave propagated to the power source layer and ground layer in the wiring board at the end of the board by interposing a capacitor between the power source layer and ground layer and surrounding the outer circumference of the board entirely with the capacitor.

However, the above method of using the decoupling capacitor can trap only the high frequency current at a particular frequency that is determined by a capacity and parasitic inductance of the decoupling capacitor, and has an adverse effect that another noise-causing high frequency current is produced at the other frequencies. Using a plurality of capacitors each having a different capacity is proposed as a solution of this problem. Nevertheless, it is still difficult to provide an improvement over a broad range of frequencies.

Also, the method of providing the capacitor to the outer circumference of the board entirely demands a capacitor of a specific shape and a great number of chip capacitors. This poses a problem that the cost is increased by the capacitor or the productivity is reduced by the time and labor required to attach the capacitor.

On the other hand, a CPU and an LSI are improved to operate at a higher frequency to increase a processing rate in the information communication field, and there has been an increasing need for a preventive measure against noises in a high frequency band of a millimeter frequency band or a microwave frequency band. However, the above-described conventional noise removing methods are not satisfactory in practical use.

BRIEF SUMMARY OF THE INVENTION

It is therefore an object of the present invention to provide a wiring board capable readily controlling variance of power source voltage and unwanted irradiation noises developed across a power source layer and a ground layer over a broad range of frequencies with a simple arrangement.

Another object of the present invention is to provide a wiring board capable readily controlling variance of power source voltage in a frequency band of GHz and unwanted irradiation noises developed across a power source layer and a ground layer over a broad range of frequencies with a simple arrangement.

Still another object of the present invention is to provide a wiring board capable readily controlling unwanted irradiation noises over a broad range of frequencies with a simple arrangement by preventing variance of power source voltage developed across a power source layer and a ground layer connected to a digitally operating electronic component from propagating to another power source layer and another ground layer, to which an input/output terminal, a cable, or the like is connected.

(1) A wiring board of the present invention, on which an electronic component is mounted, comprises: a dielectric substrate; a wiring circuit layer formed on a main surface and/or a back surface of said dielectric substrate; a power source layer formed on a main surface and/or a back surface of said dielectric substrate, and/or within said dielectric substrate; a ground layer formed on the main surface and/or back surface of said dielectric substrate, and/or within said dielectric substrate; and a connector for electrically connecting said electronic component and power source layer, and said electronic component and ground layer, and is characterized in that: either or both of said power source layer and ground layer have a low resistance area having a low sheet resistance, and a high resistance area having a high sheet resistance; said high resistance area is provided at a circumference of said low resistance area; and said connector is connected to said low resistance area.

According to the above wiring board, by providing the high resistance area at the periphery of the power source layer and/or ground layer, noises caused by a high frequency current produced in an electronic component composed of an IC or an LSI can be attenuated or dispersed in the high resistance area. Hence, resonance caused by high frequency noises does not occur between the power source layer and ground layer, and therefore, it is possible to control variance of voltage across the power source layer and ground layer while reducing irradiation noises, thereby ensuring reliability of the circuit.

(2) A wiring board of the present invention, on which an electronic component is mounted, comprises: a dielectric substrate; a wiring circuit layer formed on a main surface and/or a back surface of said dielectric substrate; a power source layer formed on a main surface and/or a back surface of said dielectric substrate, and/or within said dielectric substrate; a ground layer formed on the main surface and/or back surface of said dielectric substrate, and/or within said dielectric substrate; and a connector for electrically connecting said electronic component and power source layer, and said electronic component and ground layer, and is characterized in that: either or both of said power source layer and ground layer have a high conductivity area having a high conductivity, and a low conductivity area having a low conductivity; said low conductivity area is provided at a circumference of said high conductivity area; and said connector is connected to said high conductivity area.

According to the above wiring board, by providing the low conductivity area at the periphery of the power source layer and/or ground layer, noises caused by a high frequency current produced in an electronic component, such as an IC and an LSI, can be attenuated or dispersed in the low conductivity area. Hence, resonance caused by high frequency noises does not occur between the power source layer and ground layer, and therefore, it is possible to control variance of voltage across the power source layer and ground layer while reducing irradiation noises, thereby ensuring reliability of the circuit. The present invention is remarkably effective in preventing noises on a high frequency current in a high frequency band of 1 GHz or over, in particular, the millimeter frequency band or microwave frequency band of 10 GHz or over, generated in the electronic component, such as an IC and an LSI.

When a roughness on the interface between the low conductivity area and dielectric substrate is two or more times as great as a skin depth at the highest frequency of a signal transmitted to the wiring board, in particular, a resistance to a high frequency current passing along the surfaces of the power source layer and ground layer increases, which makes it possible to attenuate the high frequency noises effectively.

(3) A wiring board of the present invention, which an electronic component is mounted, comprises: a dielectric substrate; a wiring circuit layer formed on a main surface and/or a back surface of said dielectric substrate; a power source layer formed on a main surface and/or a back surface of said dielectric substrate, and/or within said dielectric substrate; a ground layer formed on the main surface and/or back surface of said dielectric substrate, and/or within said dielectric substrate; and a connector for electrically connecting said electronic component and power source layer, and said electronic component and ground layer, and is characterized in that: either or both of said power source layer and ground layer are separated into a first area and a second area by a high impedance strip; and said first area includes a connection to said connector.

According to the above wiring board, by separating the power source layer and/or ground layer connected to an electronic component, such as a digital IC or an LSI, into the first area including the connected portion to that electronic component and the second area of the rest by the high impedance strip, high frequency noises generated in the electronic component can be trapped and reduced in the high impedance strip. Consequently, it is possible to control variance of potential of the power source layer and ground layer in the second area.

Connecting an input/output terminal or the like to the second area can reduce irradiation noises from the input/output terminal, a cable or the like. In addition, high frequency noises caused by resonance in the power source layer and ground layer are attenuated or dispersed in the high impedance strip, and therefore, it is possible to lessen variance of voltage across the power source layer and ground layer, thereby ensuring reliability of the circuit.

The present invention is particularly effective when the electronic component operates digitally.

The following description will describe in detail a concrete arrangement of a wiring board of the present invention with reference to the accompanying drawings.

BRIEF DESCRIPTION OF THE DRAWINGS

FIGS. 4A through 4E are schematic cross sections explaining an arrangement of a connected portion of a low resistance area and the high resistance area in the wiring board of the present invention;

DETAILED DESCRIPTION OF THE INVENTION (First Embodiment)

Figure 1:
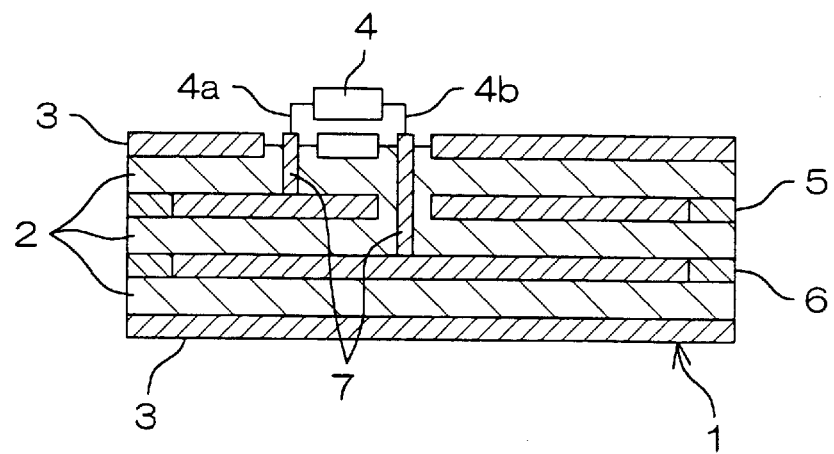
FIG. 1 is a schematic cross section showing one embodiment of a wiring board of the present invention.
Figure 2:
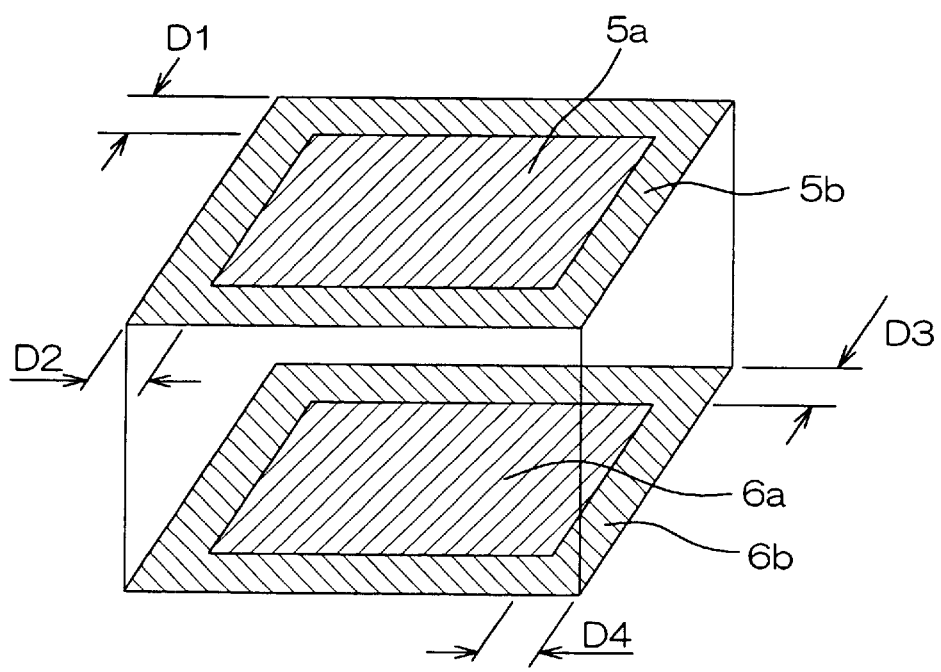
FIG. 2 is a schematic perspective view explaining an arrangement of a power source layer and a ground layer in the wiring board of FIG. 1.

FIG. 1 is a cross section showing a first embodiment of a wiring board of the present invention, and FIG. 2 is a perspective view of a power source layer and a ground layer alone taken out from the wiring board shown in FIG. 1.

In a wiring board 1 shown in FIG. 1, a wiring circuit layer 3 for signal transmission is formed on the surface of a dielectric substrate 2, and a semiconductor device 4 serving as an electronic component, such as an IC and an LSI, is mounted on the surface of the wiring board 1 and connected to the wiring circuit layer 3 provided on the surface. In FIG. 1, only one semiconductor device 4 is illustrated for ease of explanation. It should be appreciated, however, that the number of the semiconductor device 4 is not limited to one and a plurality of the semiconductor devices 4 are mounted in actual use.

In addition, a power source layer 5 and a ground layer 6 are formed within the dielectric substrate 2. A power source terminal 4a and a ground terminal 4b of the semiconductor device 4 are electrically connected to the power source layer 5 and ground layer 6, respectively through via conductors 7 provided through the dielectric substrate 2.

Examples of materials forming the dielectric substrate 2 include dielectric materials containing one of the followings (1) and (2):

(1) ceramic principally composed of alumina ($Al_2O_3$), aluminum nitride (AlN), silicon nitride ($Si_3N_4$), silicon carbide (SiC), mullite ($3Al_2O_3 \cdot 2SiO_2$), glass ceramic, etc.; and (2) organic resin, such as epoxy resin, glass-epoxy composite, imide resin, amide-imide resin and resin-ceramic composite.

Also, the wiring circuit layer 3 for signal transmission and the via conductors 7 can be made of materials, such as Cu, W, and Mo, or alloy including the foregoing.

The power source layer 5 and ground layer 6 are substantially formed by interior low resistance areas 5a and 6a having a low sheet resistance, respectively. According to the present invention, the peripheries of the low resistance areas 5a and 6a (hereinafter, referred to as the "low resistance area a" when denoted collectively) are surrounded respectively by high resistance areas 5b and 6b (hereinafter, referred to as the "high resistance area b" when denoted collectively) having a higher resistance than the low resistance area a. The low resistance area a of the power source layer 5 and ground layer 6 and the high resistance area b provided at the periphery thereof are formed continuously so as to be electrically connected.

The higher sheet resistance referred to herein means that a sheet resistance per unit area (unit $\Omega/\square$; $\square$ represents square) is relatively high in the high resistance area b in comparison with the low resistance area a. Given R1 as the sheet resistance in the low resistance area a and R2 as the sheet resistance in the high resistance area b, then it is preferable that a sheet resistance difference R2−R1 is 0.08 $\Omega/\square$ or greater, and in particular, 0.48 $\Omega/\square$ or greater.

The low resistance area a of the power source layer 5 and ground layer 6 is made of conductors, such as Cu, W, and Mo, which have been typically used as conductor materials for the wiring board. A lower sheet resistance is more preferable, and a desirable sheet resistance is 0.02 $\Omega/\square$ or less.

On the other hand, the sheet resistance in the high resistance area b is greater than the sheet resistance in the low resistance area a, and importantly, should be in a range from 0.1 $\Omega/\square$ to 1000 $\Omega/\square$. This is because when the sheet resistance in the high resistance area b is lower than 0.1 $\Omega/\square$, noise absorbing performance becomes too poor, whereas when the sheet resistance in the high resistance area b exceeds 1000 $\Omega/\square$, noises are not absorbed but reflected. The effect is great when the sheet resistance is in a range from 0.5 $\Omega/\square$ to 100 $\Omega/\square$, in particular.

According to the above arrangement, a high frequency current produced in the semiconductor device 4 propagates to the low resistance area 5a of the power source layer 5 and the low resistance area 6a of the ground layer 6 through the current terminal 4a and ground terminal 4b, respectively, and is absorbed in the high resistance areas 5b and 6b of the power source layer 5 and ground layer 6, respectively. Therefore, neither resonance occurs nor a resident wave is generated in the power source layer 5 and ground layer 6, and as a consequence, it is possible to maintain variance of voltage small while reducing irradiation noises.

In the present invention, a concrete method of forming the high resistance area is as follows.

Initially, the high resistance area b is made of a conductor material having a higher resistance than that of the low resistance area a. Examples of such a conductor material having a higher resistance include: (1) a resistor material principally composed of at least one of $SnO_2$ and $LaB_6$; and (2) a conductor material composed of at least one kind of conductor selected from Cu, W, and Mo with a content of Re, Ru, or a dielectric material.

Figure 3A:
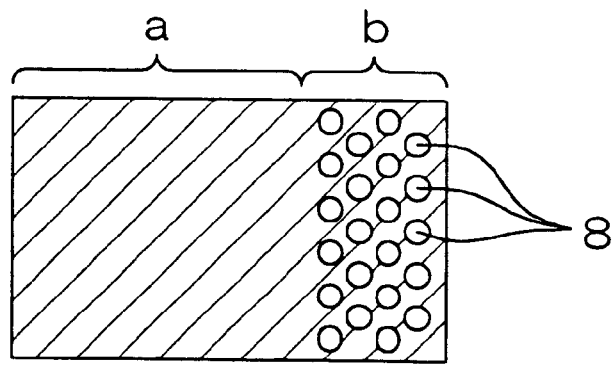
FIGS. 3A through 3C are views schematically explaining other arrangements of a high resistance area in the present invention.
Figure 3B:
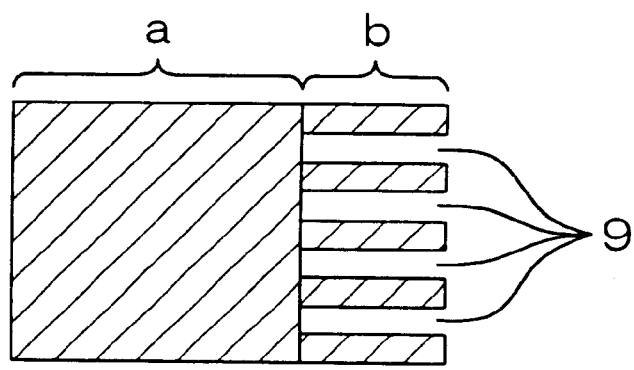
Figure 3C:
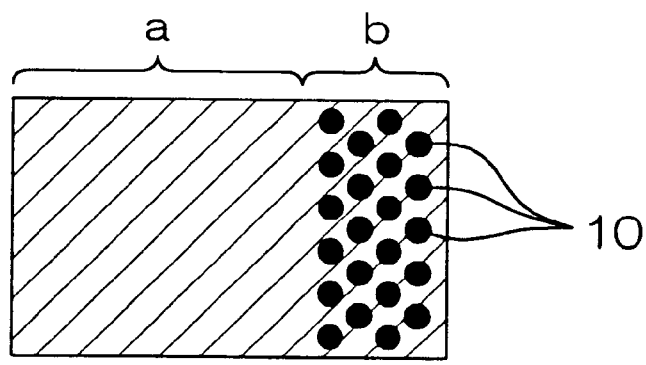

Alternatively, the high resistance area b and low resistance area a may be made of the same conductor material, and an apparent sheet resistance in the high resistance area b is increased by providing a plurality of pores 8 as shown in FIG. 3A, providing a plurality of grooves 9 as show in FIG. 3B, or scattering resistors 10 as shown in FIG. 3C. The sheet resistance can be adjusted to an arbitrary value depending on the size or number of the pores 8, grooves 9, and resistors 10.

Also, the width of the high resistance area b (denoted by D1 through D4 in FIG. 2) is preferably 0.3 mm or greater. This is because when the width of the high resistance area b is too small, not only the manufacturing becomes difficult, but also the effect of absorbing a high frequency current is lessened. The upper limit of the width of the high resistance area b is not especially imposed as long as a sufficient area can be secured for the low resistance area a. It should be noted, however, that the effect is substantially the same from the point the width exceeds 30 mm.

Figure 4A:
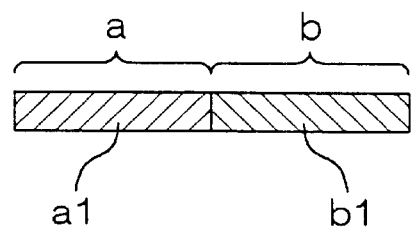
Figure 4C:
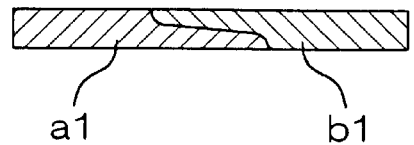

The following description will describe an arrangement of a connected portion of the low resistance area a and high resistance area b in the power source layer 5 and ground layer 6. In case that the low resistance area a and high resistance area b are made of totally different conductor materials, an arrangement as shown in FIG. 4B or 4C such that places a conductor material a1 forming the low resistance area a and a conductor material b1 forming the high resistance area b to overlap is preferable compared with an arrangement as shown in FIG. 4A such that places the low resistance area a and high resistance area b not to overlap at all.

Figure 4D:
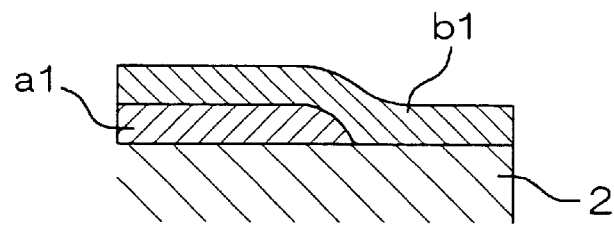

Also, in case that the power source layer 5 and ground layer 6 are formed on the surface layer of the wiring board, the conductor material b1 forming the high resistance area b may cover the conductor material a1 forming the low resistance area a entirely as shown in FIG. 4D. In this case, because a current passes through the conductor material a1 in the low resistance area a, the sheet resistance is maintained at a low value.

Figure 4E:
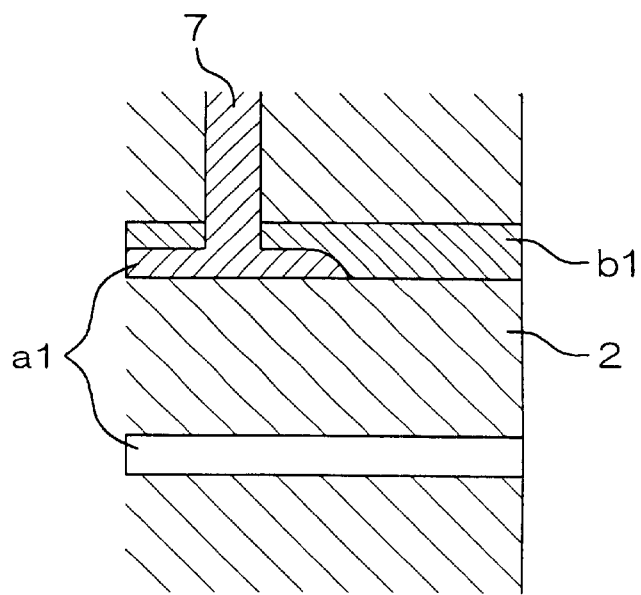

Further, as shown in FIG. 4E, in case that the power source layer 5 and ground layer 6 are formed within the substrate, it may be arranged such that the low resistance area a is formed on the respective opposing surfaces of the power source layer 5 and ground layer 6, and the high resistance area b is formed to cover the area a entirely. In this case, the via conductor 7 must be provided so as to be connected to the low resistance area a.

Figure 5A:
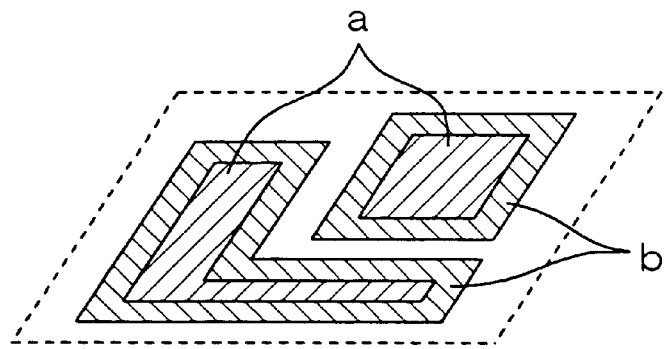
FIGS. 5A through 5C are schematic perspective views explaining other arrangements of the power source layer and ground layer in the wiring board of the present invention.
Figure 5B:
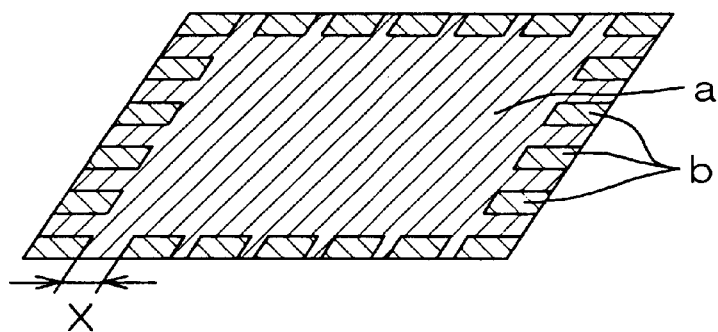
Figure 5C:
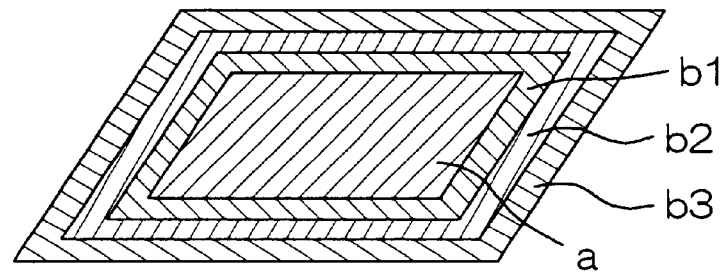

FIGS. 5A through 5C are views showing other concrete embodiments of the power source layer and ground layer in the wiring board of the present invention.

As shown in FIG. 5A, it may be arranged such that the power source layer 5 and ground layer 6 are separated into a plurality of areas, and the high resistance area b is formed at the periphery of each low resistance area a.

As shown in FIG. 5B, the high resistance area b may be formed at the periphery of the low resistance area a at regular intervals x. In this case, a noise absorption quantity is reduced with an increasing ratio of the interval x with respect to the length of periphery, and for this reason, a sum of the intervals x is preferably 1/3 or less of the overall length of the periphery.

Further, as shown in FIG. 5C, the high resistance area b may be composed of areas b1 through b3 each having a different sheet resistance. In this case, given Rb1, Rb2, and Rb3 as the sheet resistances in the areas b1, b2, and b3, respectively, then it is preferable to arrange such that the sheet resistances from inside to outside satisfy the following inequality relation: R1<Rb1<Rb2<Rb3. Also, each of the areas b1, b2, and b3 can be arranged in such a manner that the sheet resistance varies continuously from inside to outside.

(Example of First Embodiment)

Figure 6A:
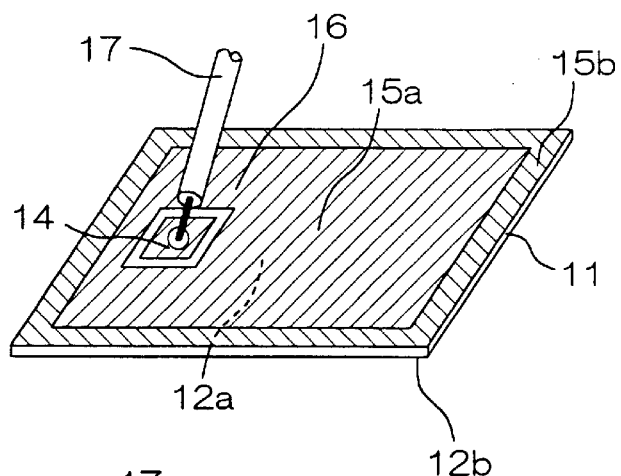
FIG. 6A is a schematic perspective view explaining an arrangement of an evaluation wiring board according to an example of the present invention.
Figure 6B:
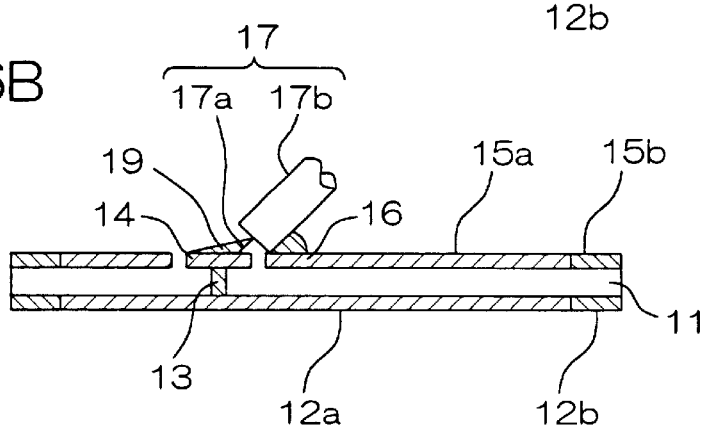
FIG. 6B is a schematic cross section explaining an arrangement of the evaluation wiring board according to the example of the present invention.

The following description will describe in detail an example of the wiring board of the present invention with reference to FIGS. 6A and 6B.

Herein, an alumina sintered body was used as a dielectric substrate 11. Initially, slurry was prepared by adding with blending an organic binder, a plasticizer, and a solvent to mixed power of $Al_2O_3$ powder added with 7 percent by weight of a sintering assistant including $SiO_2$, MgO, and CaO based on the total weight. The known doctor blade technique was applied to the slurry, whereby a ceramic green sheet of approximately 300 $\mu$m thick was formed. Then, a via 13 was made at a position used as an excitation position by providing a through hole in the ceramic green sheet by a micro-drill.

Adequate organic binder, plasticizer, solvent, etc. were added to a powder raw material principally composed of tungsten (W) with blending, whereby metal paste was obtained. The metal paste thus obtained was filled in the through hole in the ceramic green sheet by means of printing and applied as well on the surface of a through hole forming portion to be shaped into a power source terminal 14 by means of print coating.

Then, the green sheet was calcined in an atmosphere of a reducing gas, herein, a mixed gas of hydrogen ($H_2$) and nitrogen ($N_2$), at approximately 1600° C., whereby an alumina substrate having the length of 56 mm, width of 80 mm, and thickness of 250 $\mu$m was obtained.

A ground layer 15 was formed on the main surface of the alumina substrate and a power source layer 12 was formed on the back surface of the same by the following methods (Samples #1 through #11). A constant width of 4 mm was given when the high resistance area was formed.

Sample #1: both the ground layer 15 and power source layer 12 were formed out of Cu paste by means of print coating without forming the high resistance area, and baked at 900° C.

Samples #2 through #11: a low resistance area 15a of the ground layer 15 and a low resistance area 12a of the power source layer 12 were formed out of Cu paste by means of print coating, and baked at 900° C.

Here, in order to maintain electrical isolation, the print coating was omitted around the power source terminal 14 in the low resistance area 15a of the ground layer 15 as shown in FIGS. 6A and 6B. Subsequently, metal paste containing Cu—Ni (Samples #2 through #4), $LaB_6$ (Samples #5 through #8 and Samples #10 and #11), or $SnO_2$ (Sample #9) was printed on the periphery of the low resistance areas 15a and 12a of the ground layer 15 and power source layer 12, respectively so as to overlap the low resistance areas 15a and 12a as shown in FIG. 4C, and baked at 900° C., whereby high resistance areas 15b and 12b were formed.

Also, pores each having a diameter of 500 $\mu$m were made through in the high resistance area at a density set forth in Table 1 below in Samples #3 and #4.

In Sample #10, the high resistance area 12b was formed in the power source layer (D) alone, and both the interior and periphery of the ground layer were formed out of Cu alone. In Sample #11, the high resistance area 15b was formed in the ground layer (G) alone, and both the interior and periphery of the power source layer were formed out of Cu alone.

Then, the central axis 17a of a coaxial cable 17 was fixedly connected to the power source terminal 14 by solder 19, which was provided at the excitation point in the evaluation wiring boards (Samples #1 through #11) obtained in the above manner. Also, a ground tube 17b of the coaxial cable was fixedly connected to a ground terminal 16 provided inside the ground layer 15 by the solder 19.

A sine wave of 30 MHz to 1000 MHz was inputted from the coaxial cable to each evaluation wiring board thus manufactured, and a largest potential difference in a frequency range from 30 MHz to 1000 MHz was measured by bringing a high impedance measuring probe into contact with the low resistance area 12a of the power source layer 12 at a position where variance of voltage reached its maximum.

The largest potential difference in each evaluation wiring board on a base of 1 with reference to the largest potential difference in absence of the high resistance area (Sample #1) is set forth in Table 1 below. The sheet resistance of the low resistance area 12a is $3\times10^{-3}$ $\Omega/\square$.

TABLE 1

| # | Material | High Resistance Area Pore Density counts/cm$^2$ | Formed Portion | Sheet Resistance $\Omega/\square$ | Largest Potential Difference Ratio |
|---|---|---|---|---|---|
| *1 | Cu | 0 | — | $3 \times 10^{-3}$ | 1.00 |
| *2 | Cu—Ni | 0 | D, G | $4 \times 10^{-2}$ | 0.93 |
| 3 | Cu—Ni | 150 | D, G | $1 \times 10^{-1}$ | 0.50 |
| 4 | Cu—Ni | 350 | D, G | $8 \times 10^{-1}$ | 0.38 |
| 5 | $LaB_6$ | 0 | D, G | $1 \times 10^1$ | 0.31 |
| 6 | $LaB_6$ | 0 | D, G | $1 \times 10^2$ | 0.36 |
| 7 | $LaB_6$ | 0 | D, G | $1 \times 10^3$ | 0.49 |
| *8 | $LaB_6$ | 0 | D, G | $1 \times 10^4$ | 0.96 |
| *9 | $SnO_2$ | 0 | D, G | $1 \times 10^5$ | 1.00 |
| 10 | $LaB_6$ | 0 | D | $1 \times 10^1$ | 0.33 |
| 11 | $LaB_6$ | 0 | G | $1 \times 10^2$ | 0.34 |

*: comparative example
D: power source layer
G: ground layer

Table 1 reveals that a ratio of the largest potential difference was maintained as low as 0.5 or below in the wiring boards of Samples #3 through #7 and Samples #10 and #11, in which the high resistance area was formed, whereas a ratio of the largest potential difference was equal to or nearly equal to 1 in Samples #1, #2, #8, and #9 having a sheet resistance value beyond the range set in the present invention, indicating that considerable variance of voltage had occurred.

(Second Embodiment)

In the first embodiment above, the high resistance area having a high resistance with a sheet resistance ranging from 0.1 Ω/□ to 1000 Ω/□ was provided at the peripheral portion the power source layer and/or ground layer as the method of controlling variance of voltage and a resident wave developed across the power source layer and ground layer within the dielectric substrate.

The above sheet resistance control is applicable when removing noises at frequencies lower than 1 GHz. However, in a frequency band for frequencies as high as 1 GHz or over, particularly in the microwave frequency band or millimeter frequency band, a current flows near the interface between the conductor and dielectric substrate (skin effect), and the effective resistance becomes higher than a volume resistivity. This makes the effect of the sheet resistance control unsatisfactory in some cases.

Therefore, in a second embodiment, the low resistance area $5a$ of the power source layer $5$, the low resistance area $6a$ of the ground layer $6$, the high resistance area $5b$ of the power source layer $5$, and the high resistance area $6b$ of the ground layer $6$ are evaluated not by the sheet resistance but by conductivity (unit $\Omega^{-1} \cdot m^{-1}$=S/m).

The following description will describe the second embodiment with reference to FIGS. 1 through 5.

In the arrangement shown in FIGS. 1 and 2, the periphery of interior high conductivity areas $5a$ and $6a$ (hereinafter, referred to as the "high conductivity area a" when denoted collectively) of the power source layer $5$ and ground layer $6$ are surrounded respectively by low conductivity areas $5b$ and $6b$ (hereinafter, referred to as the "low conductivity area b" when denoted collectively) having a relatively low conductivity in comparison with the high conductivity area a. Given σ1 as the conductivity in the high conductivity area a and σ2 as the conductivity in the low conductivity area b, then it is preferable that a conductivity difference σ1−σ2 is $1 \times 10^7 \, \Omega^{-1} \cdot m^{-1}$ or greater, and in particular, $2 \times 10^7 \, \Omega^{-1} \cdot m^{-1}$ or greater.

The high conductivity area a of the power source layer $5$ and ground layer $6$ is made of conductors, such as Cu, W, and Mo, which have been typically used as conductor materials for the wiring board. In order to lessen a voltage drop due to a conductor loss, a higher conductivity is more preferable, and a desirable conductivity is $1.0 \times 10^7 \, \Omega^{-1} \cdot m^{-1}$ or greater. Also, a roughness on the interface between the conductor layer (high conductivity area a) and dielectric substrate $2$ is preferably 0.5 μm or smaller, and most preferably 0.1 μm or smaller, because a too rough surface increases a resistance to high frequencies.

On the other hand, the conductivity in the low conductivity area b is preferably in a range from $70 \, \Omega^{-1} \cdot m^{-1}$ to $5 \times 10^6 \, \Omega^{-1} \cdot m^{31 \, 1}$. This is because when the conductivity in the low conductivity area b is $5 \times 10^6 \, \Omega^{-1} \cdot m^{-1}$ or greater, high frequency current absorbing performance becomes too poor, whereas when the conductivity in the low conductivity area b is $70 \, \Omega^{-1} \cdot m^{-1}$ or smaller, a high frequency current is not absorbed but reflected. The high frequency current absorbing effect is great when the conductivity is in a range from $100 \, \Omega^{-1} \cdot m^{-1}$ to $1 \times 10^4 \, \Omega^{-1} \cdot m^{-1}$, in particular.

Generally, the skin resistance in the high frequency range of 1 GHz or over varies with the surface roughness of the conductor. This is because a current flows near the surface of the conductor when the frequency is high, and the path a high frequency signal travels is extended with an increasing surface roughness of the conductor, thereby increasing a resistance. For example, when the surface roughness is three times as great as the skin depth, the skin resistance is increased by approximately two times. In case of copper, the skin depth is approximately 0.7 μm for a signal of 10 GHz, and if the surface roughness is set to 2 μm or greater, the skin resistance is increased by approximately two times.

Thus, according to the present invention, the high frequency noises can be attenuated by increasing the roughness on the interface between the low conductivity area b and dielectric substrate $2$ by two or more times, in particular, by three or more times as great as the skin depth at the highest frequency of a signal transmitted to the wiring board.

The skin depth referred to herein means a parameter that represents a depth at which the intensity of the magnetic field within the conductor reaches 0.368 (l/e) of a value on the interface of the conductor, and is generally expressed by Equation (1):

$$\delta = (2/\omega\mu\sigma)^{1/2} \quad (1)$$

where

δ: skin depth

ω: angular frequency (ω=2πf)

f: frequency

μ: magnetic permeability

σ: conductivity.

According to the present invention, when arranged in the above manner, a high frequency current produced in the semiconductor device $4$ propagates from the current terminal $4a$ and ground terminal $4b$ to the high conductivity area $5a$ of the power source layer $5$ and the high conductivity area $6a$ of the ground layer $6$, and is absorbed in the low conductivity area b of the power source layer $5$ and ground layer $6$. Therefore, neither resonance occurs nor a resident wave is generated in the power source layer $5$ and ground layer $6$, and as a consequence, it is possible to maintain variance of voltage small while reducing irradiation noises.

A method of adding inorganic powder to the conductor layer forming the low conductivity area b is suitable in forming the low conductivity area b. A quantity of the inorganic powder is preferably 10 percent by weight or more based on the total weight. Inorganic powder composed of constituents similar to or identical with those forming the dielectric substrate is suitable in terms of adhesion or the like.

In the present invention, a concrete method of forming the low conductivity area is as follows.

In case that the dielectric substrate is made of ceramic, such as alumina and glass ceramic, powder of raw materials of the foregoing is made into a green sheet by a known sheet forming technique, such as the doctor blade technique.

Then, the interface between the conductor layer and dielectric substrate is made rough by pressing a panel with rough surface finishing against the green sheet at portions that will be made into the peripheral portions of the ground layer and power source layer, or by scattering coarse ceramic powder composed of the same constituents as those of the dielectric substrate at the peripheral portions of the green sheet, and then applying conductor paste on the area processed by either of the foregoing by means of print coating.

Also, coarse ceramic powder composed of the major constituent of the dielectric substrate or the constituents same as those of the dielectric substrate is added to the conductor paste, and the resulting conductor paste is applied to the portion forming the low conductivity area b by means of print coating. A quantity of added ceramic powder is preferably 10 percent by weight or more based on the total weight of the conductor paste.

Alternatively, the conductivity in the low conductivity area b can be adjusted by selecting the conducting materials besides the above-described ceramic powder adding method. Examples of a conductor material having a low conductivity include: a low conductivity material principally composed of at least one of $SnO_2$ and $LaB_6$; and conductor material composed of at least one kind of conductor selected from Cu, W, and Mo with a content of Re, Ru, or a dielectric material. Consequently, it is possible to lower the conductivity in the low conductivity area b.

Further, modifying the arrangement of the low conductivity area b can lower the conductivity therein.

For example, an apparent conductivity in the low conductivity area b can be lowered by providing a plurality of pores 8 as shown in FIG. 3A, providing a plurality of grooves 9 as show in FIG. 3B, or scattering resistors 10 as shown in FIG. 3C. The conductivity can be adjusted depending on the size or number of the pores 8, grooves 9, and resistors 10.

Also, the width of the peripheral portion of the low conductivity area b is preferably 0.1 mm or greater. This is because when the width of the low conductivity area b is too small, not only the manufacturing becomes difficult, but also the effect of absorbing a high frequency current is lessened. The upper limit of the width of the low conductivity area b is not especially imposed as long as a sufficient area can be secured for the high conductivity area a. It should be noted, however, that the effect is substantially the same from the point the width exceeds 30 mm.

As to an arrangement of a connected portion of the high conductivity area a and low conductivity area b, in case that these areas are made of totally different conductor materials, an arrangement as shown in FIG. 4B or 4C such that places a conductor material a1 forming the high conductivity area a and a conductor material b1 forming the low conductivity area b to overlap is preferable compared with an arrangement as shown in FIG. 4A such that places the high conductivity area a and low conductivity area b not to overlap at all. Also, in case that the power source layer 5 and ground layer 6 are formed on the surface layer of the wiring board, the conductor material b1 forming the low conductivity area b may cover the conductor material a1 forming the high conductivity area a entirely as shown in FIG. 4D. In the arrangement shown in FIG. 4D, a current flows through the high conductivity area a at the side touching the dielectric substrate 2, which prevents the conductivity from dropping.

Further, as shown in FIG. 4E, in case that the power source layer 5 and ground layer 6 are formed within the substrate, it may be arranged such that the high conductivity area a is formed on the respective opposing surfaces of the power source layer 5 and ground layer 6, and the low conductivity area b is formed to cover the area a entirely. In this case, the via conductor 7 must be provided so as to be connected to the high conductivity area a.

FIGS. 5A through 5C are views showing other concrete embodiments of the power source layer and ground layer in the wiring board of the present invention.

As shown in FIG. 5A, it may be arranged such that the power source layer 5 and ground layer 6 are separated into a plurality of areas, and the low conductivity area b is formed at the periphery of each high conductivity area a. As shown in FIG. 5B, the low conductivity area b may be formed at the periphery of the high conductivity area a at regular intervals x. In this case, a noise absorption quantity is reduced with an increasing ratio of the interval x with respect to the length of the periphery, and for this reason, a sum of the intervals x is preferably 1/3 or less of the overall length of the periphery.

In addition, as shown in FIG. 5C, the low conductivity area b may be composed of areas b1 through b3 each having a different conductivity. In this case, given σa as the conductivity in the high conductivity area a, and σb1, σb2, and σb3 as the conductivities in the areas b1, b2, and b3, respectively, then it is preferable to arrange such that the conductivities from inside to outside satisfy the following inequality relation: σa>σb1>σb2 >σb3. Also, each of the areas b1, b2, and b3 can be arranged in such a manner that the conductivity varies continuously from inside to outside.

Figure 7A:
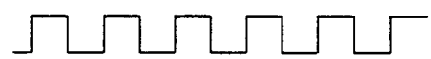
FIGS. 7A through 7D are schematic cross sections explaining an arrangement of an interface of a low conductivity area in the wiring board of the present invention.
Figure 7B:
Figure 7C:
Figure 7D:

Further, the surface of the dielectric substrate 2 in the low conductivity area b can be of a repeating shape, such as a rectangle as shown in FIG. 7A, a triangle as shown in FIG. 7B, and a rounded shape as shown in FIG. 7C, or an irregular concave and convex pattern as shown in FIG. 7D when the inorganic power is added to the conductor layer.

A material of the dielectric substrate 2, and materials of the wiring circuit layer 3 and via conductors 7 can be the same as those used in the first embodiment.

(Example of Second Embodiment)

Figure 8A:
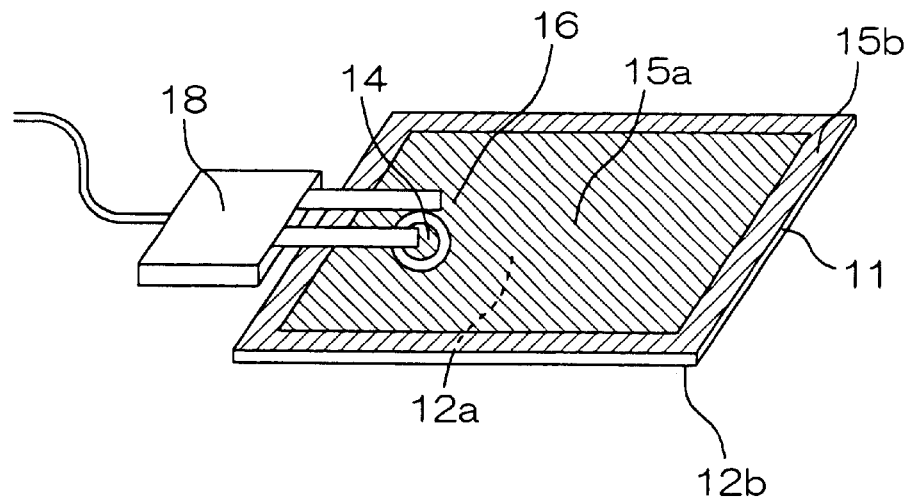
FIG. 8A is a schematic perspective view explaining an arrangement of an evaluation wiring board according to an example of the present invention.
Figure 8B:
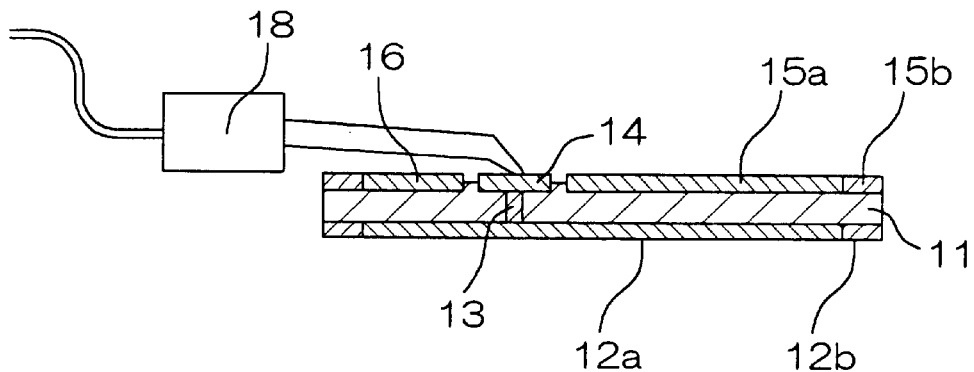
FIG. 8B is a schematic cross section explaining an arrangement of the evaluation wiring board according to the example of the present invention.

The following description will describe in detail an example of the wiring board of the present invention with reference to FIGS. 8A and 8B. In the wiring board of the present example, an alumina sintered body was used as a dielectric substrate 11. Initially, slurry was prepared by adding with blending an organic binder, a plasticizer, and a solvent to mixed power of $Al_2O_3$ having an average particle size of 0.2 μm added with 7 percent by weight of a sintering assistant including $SiO_2$, MgO, and CaO based on the total weight. Then, the known doctor blade technique was applied to the slurry, whereby a ceramic green sheet of approximately 250 μm thick was formed. Subsequently, a via 13 was made at a position used as an excitation position by providing a through hole in the ceramic green sheet by the perforating technique.

Adequate organic binder, plasticizer, solvent, etc. were added to a powder raw material principally composed of tungsten (W) with blending, whereby metal paste was obtained. The metal paste thus obtained was filled in a through hole portion in the ceramic green sheet by means of printing, and applied as well on the surface of a through hole forming portion to be shaped into a power source terminal 14 by means of print coating.

Then, the green sheet that had undergone print coating was calcined in a reducing atmosphere of a mixed gas of hydrogen ($H_2$) and nitrogen ($N_2$) at 1600° C., whereby an alumina substrate having the length of 56 mm, width of 80 mm, and thickness of 250 μm was obtained.

Subsequently, a ground layer 15 was formed on the main surface of the alumina substrate and a power source layer 12 was formed on the back surface of the same by the following methods. A constant width of 4 mm was given when the low conductivity area b was formed. Then, Samples #1 through #10 were obtained in the following manner.

In Sample #1, both the ground layer 15 and power source layer 12 were formed out of Cu paste by means of print coating without forming the low conductivity area, and baked at 900° C.

In Samples #2 through #10, a high conductivity area 15a of the ground layer 15 and a high conductivity area 12a of the power source layer 12 were formed out of Cu paste by means of print coating, and baked at 900° C. Here, as shown in FIG. 8B, the print coating was omitted at and around the power source terminal 14 pre-formed out of tungsten in the high conductivity area 15a of the ground layer 15. Subsequently, metal paste prepared by adding an alumina constituent to Cu, Cu—W, Cu—Ni, or $LaB_6$ as necessary in a ratio set forth in Table 2 below was printed at the periphery of the high conductivity areas 15a and 12a of the ground layer 15 and power source layer 12, respectively in such a manner so as to overlap the high conductivity areas 15a and 12a as shown in FIG. 4C, and baked at 900° C., whereby low conductivity areas 15b and 12b were formed.

Also, in Samples #4 through #10, the surface of the dielectric substrate was made rough mechanically by pressing a panel with rough surface finishing against the dielectric substrate at portions to be made into the low conductivity areas 12b and 15b (surface finishing press).

Further, in Sample #8, the low conductivity area was formed in the power source layer (D) alone, and in Sample #9, the low conductivity area was formed in the ground layer (G) alone.

The tip of a wafer probe 18 was brought into contact with the power source terminal 14 and ground terminal 16 provided at excitation positions in the evaluation alumina wiring boards of Samples #1 through #10 obtained in the above manner, and a return loss (S11) was measured by a network analyzer in a frequency range from 1 GHz to 40 GHz. Here, Sample having −5 dB or lower in a frequency range from 20 GHz to 30 GHz as the largest value of S11 was judged as effective in controlling variance of voltage.

The roughness (Ra: surface roughness) on the interface between the dielectric substrate and the conductor layer in the low conductivity area was measured by using a BEM (reflection electron image) of a scanning electron microscope. The skin depth was set to 3.4 μm, which was the value of Cu at a frequency of 500 MHz (the highest frequency of a signal transmitted to the wiring board). In Table 2 below, a ratio of the surface roughness and skin depth is set forth in the column of "surface roughness/skin depth".

The conductivity of the conductor forming the low conductivity area was measured by manufacturing a substrate having a line path with a width of 2 mm and a length of 30 mm on one surface of a 0.2-mm-thick dielectric layer, and measuring a resistance value of the line path by a 4-terminal measuring method. The thickness of the line path was measured by observing the cross section with a metallurgical microscope.

TABLE 2

| # | Low Conductivity Area Material | Surface Roughness/Skin Depth | Surface Finishing Press | Inorganic Materials Added to Conductor Layer wt % | Formed Portion | Conductivity $\Omega^{-1} \cdot m^{-1}$ | Si1 dB |
|---|---|---|---|---|---|---|---|
| *1 | Cu | 0.95 | X | 3 | — | $3.0 \times 10^7$ | −1.21 |
| *2 | Cu | 1.64 | X | 8 | D, G | $1.7 \times 10^7$ | −3.28 |
| *3 | Cu—W | 0.68 | X | 3 | D, G | $4.7 \times 10^6$ | −4.71 |
| 4 | Cu—W | 2.73 | ○ | 8 | D, G | $4.7 \times 10^6$ | −5.02 |
| 5 | Cu—W | 2.23 | ○ | 20 | D, G | $4.4 \times 10^6$ | −6.42 |
| 6 | Cu—Ni | 2.11 | ○ | 20 | D, G | $8.8 \times 10^5$ | −8.02 |
| 7 | $LaB_6$ | 2.58 | ○ | 20 | D, G | $4.8 \times 10^3$ | −13.56 |
| 8 | $LaB_6$ | 2.74 | ○ | 20 | D | $5.3 \times 10^3$ | −12.39 |
| 9 | $LaB_6$ | 2.71 | ○ | 20 | G | $5.1 \times 10^2$ | −8.39 |
| *10 | $LaB_6$ | 2.41 | ○ | 20 | D, G | $5.1 \times 10^1$ | −4.62 |

*: comparative example
D: power source layer
G: ground layer

Table 2 reveals that the return loss S11 was attenuated by 5 dB or more in Samples #4 through #9, in which the low conductivity area was formed, indicating that the effect of the present invention was achieved.

On the contrarily, the return loss was less than 5 dB in Sample #1, in which the low conductivity area was not formed.

Also, even when the conductivity in the low conductivity area was in an adequate range, a satisfactory effect was not achieved if the "surface roughness/skin depth" is smaller than times like in Samples #2 and #3, and if the conductivity the low conductivity area was too low like in Sample #10. In view of the foregoing, it is understood that it is necessary to set the above ratio to two or more times in a high frequency range from 1 to 40 GHz.

(Third Embodiment)

The following description will describe a concrete arrangement according to a third embodiment of the present invention with reference to the accompanying drawings.

Figure 9:
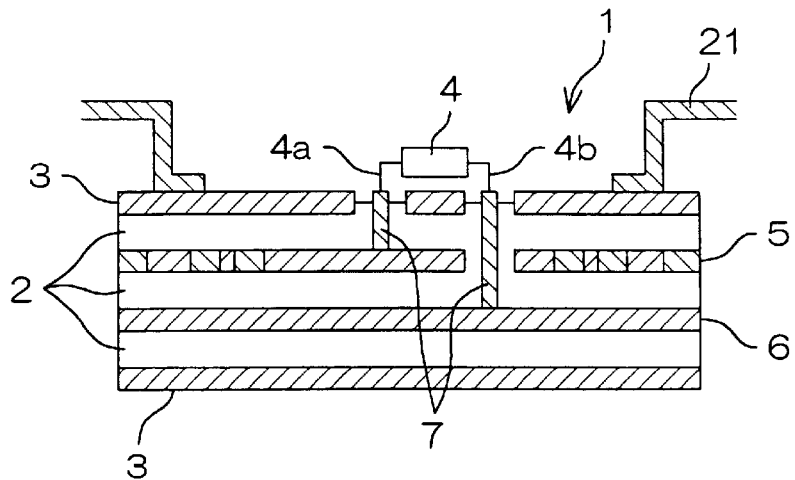
FIG. 9 is a schematic cross section showing one embodiment of the wiring board of the present invention.
Figure 10:
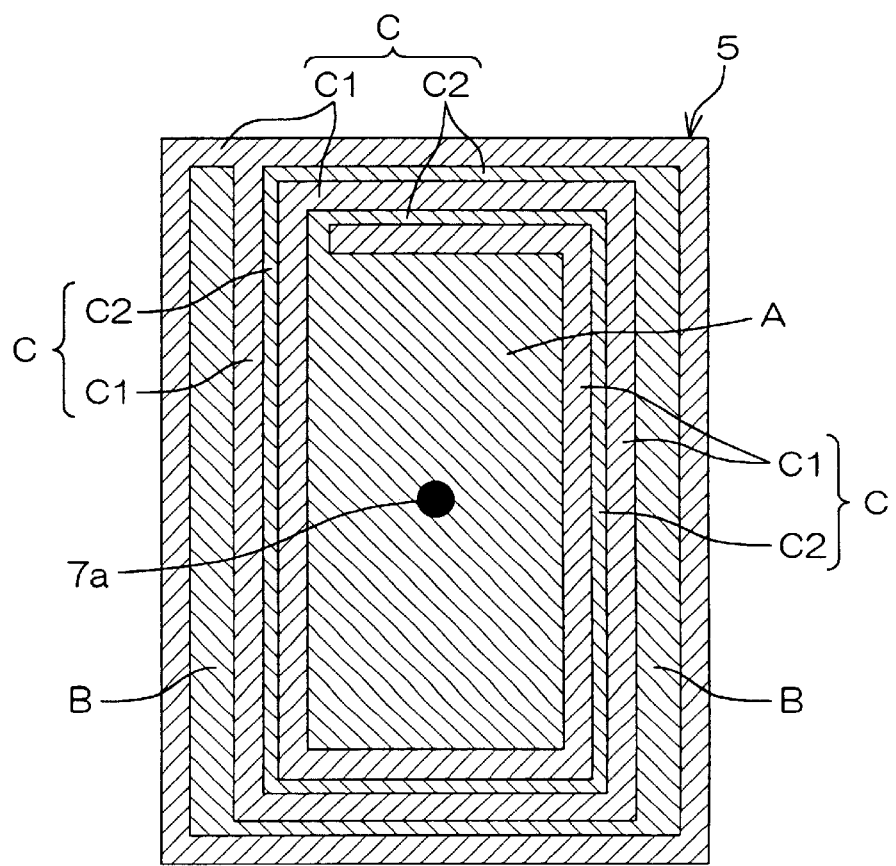
FIG. 10 is a view illustrating a pattern of the power source layer showing one embodiment of the wiring board of the present invention.

FIG. 9 is a cross section of a wiring board, and FIG. 10 is a view showing a pattern of a power source layer in the wiring board of FIG. 9.

In a wiring board 1 shown in FIG. 9, a wiring circuit layer 3 for signal transmission is formed on the surface of a dielectric substrate 2, and a semiconductor device 4 serving as a digitally operating electronic component, such as a C-MOS integrated circuit, is mounted on the surface of the wiring board 1 and connected to the wiring circuit layer 3 provided on the surface (this connection state is not illustrated). Numeral 21 denotes an input/output terminal.

In addition, a power source layer 5 and a ground layer 6 are formed within the dielectric substrate 2. A power source terminal 4a and a ground terminal 4b of the semiconductor device 4 are electrically connected to the power source layer 5 and ground layer 6, respectively through via conductors 7 provided through the dielectric substrate 2.

According to the present invention, as shown in FIG. 10, major characteristics are that the power source layer 5 and/or ground layer 6 are separated into an area A including at least a connection 7a to the via conductor 7 serving as a connecting body and an area B of the rest by a high impedance strip C. In the drawing, a first area A (hereinafter, referred to simply as the "area A") connected to a digitally operating electronic component is formed near the center of the wiring board 1, and a second area B (hereinafter, referred to simply as the "area B") is formed at both sides of the area A in such a manner that the input/output terminal 21 is connected to or provided in the vicinity of the area B. A high impedance strip C is provided between these areas A and B.

According to the above arrangement, when attention is focused on the power source layer 5, for example, a high frequency current produced in the semiconductor device 4 propagates to the area A of the power source layer 5 through the power source terminal 4a and via conductor 7 and is absorbed and attenuated in the high impedance strip C provided to surround the area A. This makes it possible to control variance of potential of the power source layer 5 and ground layer 6 in the area B connected to the input/output terminal 21, thereby reducing irradiation noises from the input/output terminal 21, a cable, or the like.

As shown in FIG. 10, the high impedance strip C is composed of a high resistance strip C1 and a low resistance strip C2. It is preferable to shape the high resistance strip C1 comb-wise or in spirals in order to effectively absorb and attenuate high frequency noises in a hard-to-absorb mode. Also, it is preferable to shape the low resistance strip C2 in meanders (fanfolds, zigzags) or spirals.

In addition, the high resistance strip C1 is provided at the entire peripheral portion of the power source layer 5.

By shaping the high resistance strip C1 comb-wise or in spirals, the low resistance strip C2 formed between the high resistance strips C1 is shaped in meanders or spirals. This gives rise to a large inductance component and makes it difficult for high frequency noises to propagate from the area A to the area B. As a consequence, it is possible to control variance of voltage in the area B markedly.

Although the areas A and B are separated by the high impedance strip C in terms of high frequencies, a connection is established therebetween by the low resistance strip C2 forming the high impedance strip C to allow a direct current or low frequency current to pass through.

The power source layer 5, ground layer 6, and the low resistance strip C2 forming the high impedance strip C are preferably made of conductor materials principally composed of at least one kind of element selected from Cu, W, and Mo, for example, which are generally used as conductor materials.

On the other hand, the high resistance strip C1 in the high impedance strip C has a relatively high sheet resistance in comparison with the conductor materials forming the low resistance strip C2 and the other components including the power source layer 5 and ground layer 6. Given R1 as the sheet resistance of the conductor material forming the areas A and B, and R2 as the sheet resistance in the high resistance strip C1, then it is preferable that a sheet resistance difference R2−R1 is 0.08 Ω/□ or greater, and in particular, 0.48 Ω/□ or greater.

In particular, it is preferable that the sheet resistance value of the high resistance strip C1 is in a range from 0.01 Ω/□ to 10000 Ω/□. This is because when the sheet resistance in the high resistance strip C1 is lower than 0.01 Ω/□, noise absorbing and attenuating performance becomes too poor to form the high impedance strip C, whereas when the sheet resistance in the high resistance strip C1 exceeds 10000 Ω/□, noises are not absorbed but reflected. Particularly, the most suitable range of the sheet resistance value of the high resistance strip C1 is from 0.5 Ω/□ to 100 Ω/□.

In the present invention, forming the high resistance strip C1 out of a conductor material having a higher resistance than that of the low resistance strip C2 is preferable as a concrete method of forming the high resistance strip C1. Examples of such a conductor material having a higher resistance include a resistor material principally composed of at least one of $SnO_2$ and $LaB_6$, and a conductor material made of at least one kind of conductor selected from Cu, W, and Mo with a content of at least one element selected from the group consisting of Re, Ru, and a dielectric material.

Also, the strip width of the high resistance strip C1 forming the high impedance strip C is preferably 0.1 mm or greater. This is because when the width of the high resistance strip C1 is too small, not only the manufacturing becomes difficult, but also the effect of reducing noises is lessened. The upper limit of the strip width of the high resistance strip C1 is not especially imposed as long as the areas A and B can be secured. It should be noted, however, that the effect is substantially the same from the point the strip width exceeds 30 mm.

The high resistance strip C1 in the high impedance strip C is formed continuously with the low resistance strip C2 and the areas A and B of the power source layer 5 and ground layer 6 so as to be electrically connected.

FIGS. 11 through 15 are views showing other concrete embodiments of the power source player 5.

Figure 11:
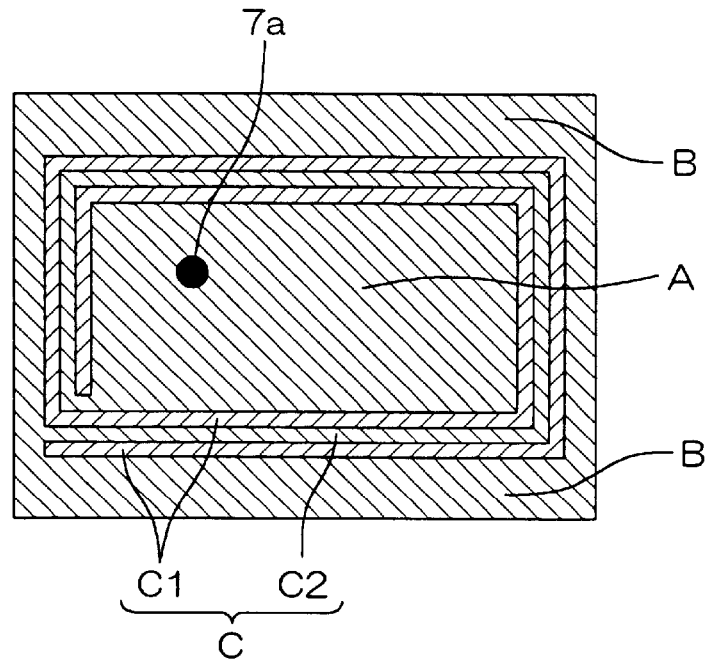
FIG. 11 is a view illustrating another pattern of the power source layer in the wiring board of the present invention.

FIG. 11 shows a pattern where the high impedance strip that is provided at the entire peripheral portion of the power source layer 5 in the pattern shown in FIGS. 9 and 10 is omitted.

Figure 12:
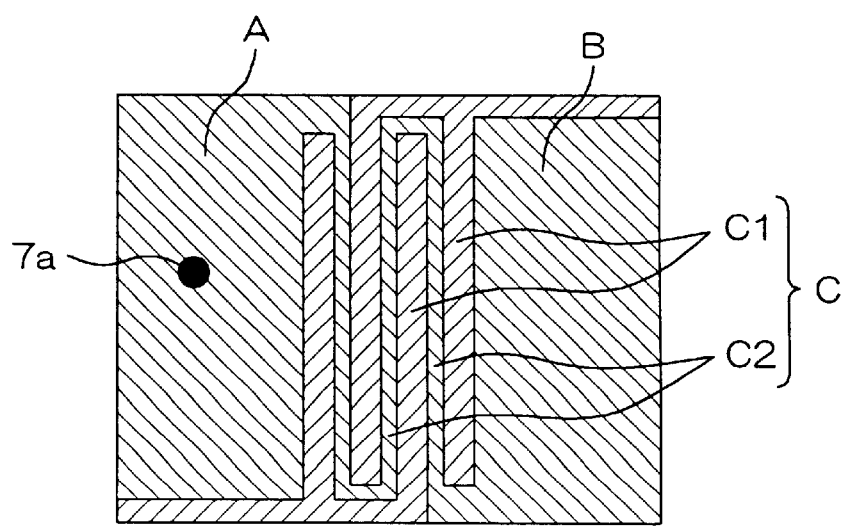
FIG. 12 is a view illustrating still another pattern of the power source layer in the wiring board of the present invention.

FIG. 12 is a view showing a pattern where the areas A and B are separated by forming the area A having the connection 7a to the digital operating electronic component at the left side of the board, the area B connected to the input/output terminal at the right side, and the high impedance strip C at the center. The high resistance strip C1 in the high impedance strip C is shaped comb-wise, and the areas A and B are connected to each other by the low resistance strip C2 shaped in meanders and provided between the comb-wise high resistance strips C1.

Figure 13:
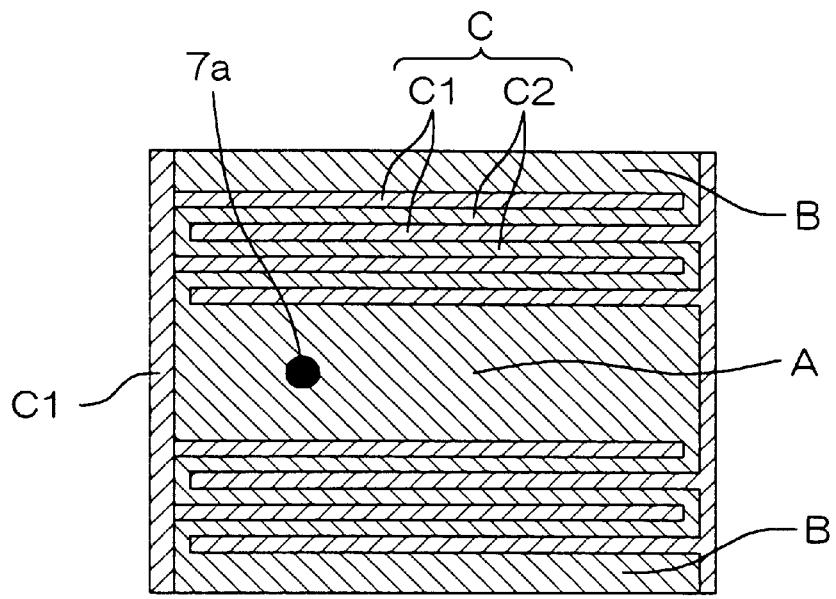
FIG. 13 is a view illustrating still another pattern of the power source layer in the wiring board of the present invention.

FIG. 13 is a view showing a pattern where the areas A and B are separated by forming the area A having the connection 7a to the digitally operating electronic component at the center of the board, the area B connected to the input/output terminal above and below the area A, and the high impedance strip C at the top and bottom of the area A. The high resistance strip C1 in the high impedance strip C is shaped comb-wise, and the areas A and B are connected to each other by the low resistance strip C2 shaped in meanders and provided between the comb-wise high resistance strips C1.

Figure 14:
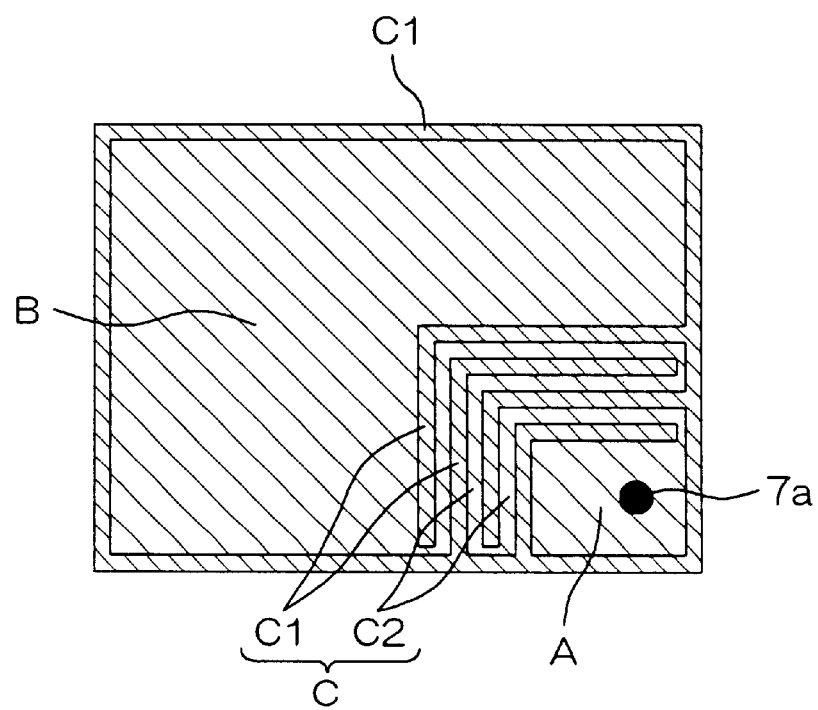
FIG. 14 is a view illustrating still another pattern of the power source layer in the wiring board of the present invention.

FIG. 14 is a view showing a pattern where the areas A and B are separated by forming the area A having the connection 7a to the digitally operating electronic component at the lower right corner of the board, the area B connected to the input/output terminal at the rest of the board, and the high impedance strip C to encircle the lower right corner area. The high resistance strip C1 in the high impedance strip C is shaped comb-wise, and the areas A and B are connected to each other by the low resistance strip C2 shaped in meanders and provided between the comb-wise high resistance strips C1.

Figure 15:
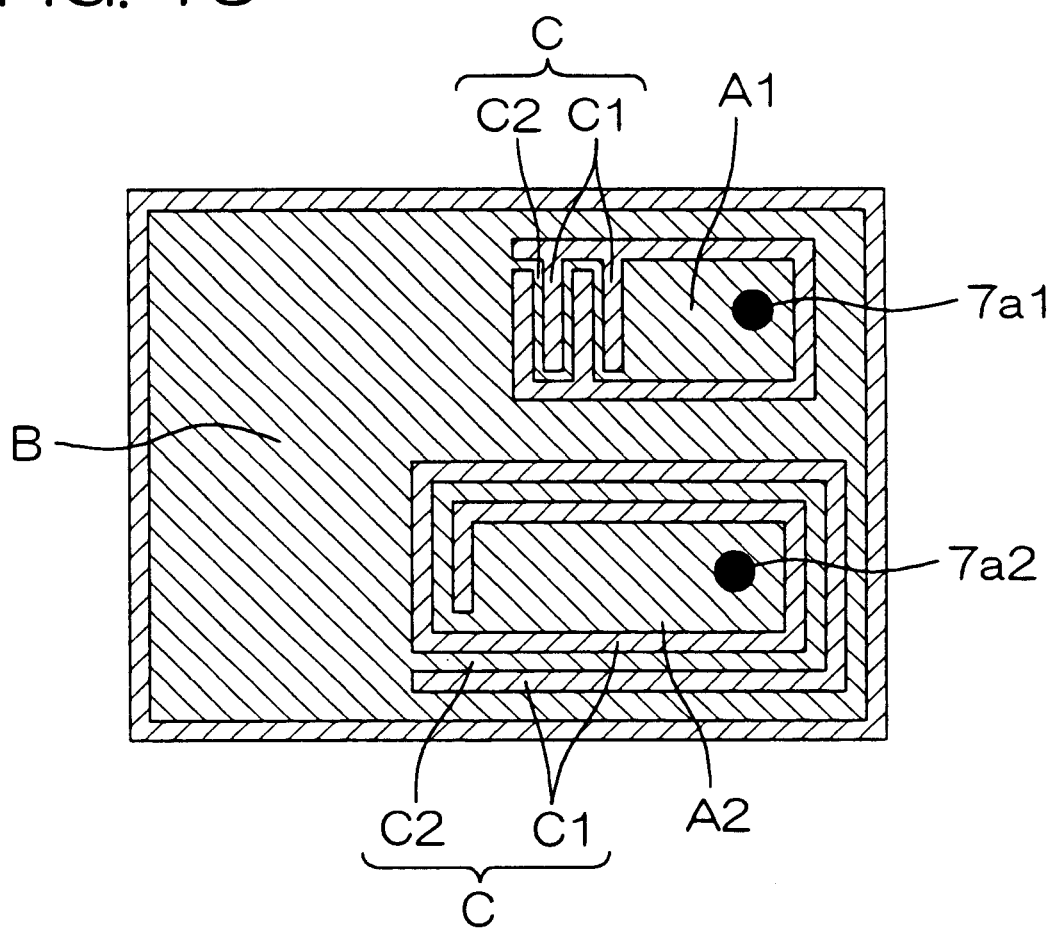
FIG. 15 is a view illustrating still another pattern of the power source layer in the wiring board of the present invention.

FIG. 15 is a view showing a pattern where the connection 7a to the digitally operating electronic component is provided to the board at two positions, 7a1 and 7a2, and an area A1 having the connection 7a1, an area A2 having the connection 7a2, and an area B connected to the input/output terminal are placed. Here, the two areas A1 and A2 are separated from the area B by forming the high impedance strip C to surround the two connections 7a1 and 7a2.

In the area A1, the high resistance strip C1 in the high impedance strip C is shaped comb-wise, and the areas A1 and B are connected to each other by the low resistance strip C2 shaped in meanders and provided between the comb-wise high resistance strips C1. In the area A2, the high resistance strip C1 in the high impedance strip C is shaped in spirals, and the areas A2 and B are connected to each other by the low resistance strip C2 shaped in spirals.

Examples of materials forming the dielectric substrate 2 include dielectric materials containing a dielectric substrate principally composed of alumina ($Al_2O_3$), ceramic principally composed of aluminum nitride (AlN), silicon nitride ($Si_3N_4$), silicon carbide (SiC), mullite ($3Al_2O_3 \cdot 2SiO_2$), glass ceramic, etc., and organic resin, such as epoxy resin and glass-epoxy composite, imide resin, amide-imide resin and resin-ceramic composite.

Also, the wiring circuit layer 3 and via conductors 7 can be made of materials, such as Cu, W, and Mo, or alloy including the foregoing.

(Example of Third Embodiment)

Figure 16A:
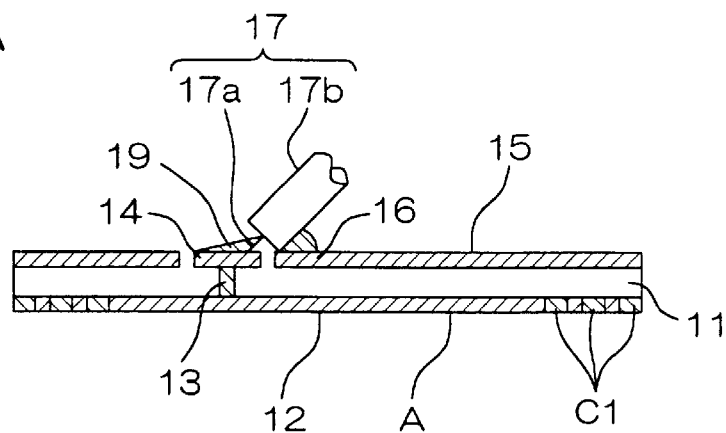
FIG. 16A is a schematic cross section showing an arrangement of an evaluation wiring board according to an example of the present invention.
Figure 16B:
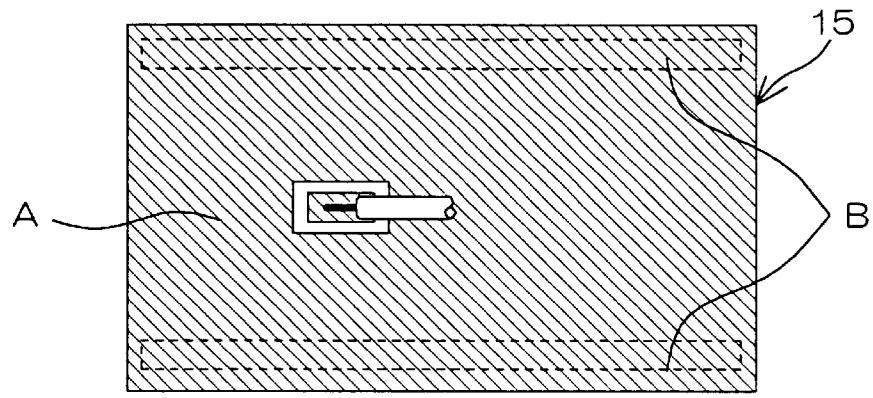
FIG. 16B is a plan view showing an arrangement of the evaluation wiring board according to the example of the present invention.

The following description will describe in detail an example of the wiring board of the present invention with reference to FIGS. 16A and 16B.

In the wiring board of the present example, an alumina sintered body was used as a dielectric substrate 11. Initially, slurry was prepared by adding with blending an organic binder, a plasticizer, and a solvent to mixed power of $Al_2O_3$ powder added with 7 percent by weight of a sintering assistant including $SiO_2$, MgO, and CaO based on the total weight. The known doctor blade technique was applied to the slurry, whereby a ceramic green sheet of approximately 300 μm thick was formed. Then, a via 13 was made at a position used as an excitation position by providing a through hole in the ceramic green sheet by a micro-drill.

Adequate organic binder, plasticizer, solvent, etc. were added to a powder raw material principally composed of tungsten (W) with blending, whereby metal paste was obtained. The metal paste thus obtained was filled in a through hole portion in the ceramic green sheet and applied as well by means of print coating.

Then, the green sheet was calcined in a reducing atmosphere of a mixed gas of hydrogen ($H_2$) and nitrogen ($N_2$) at approximately 1600° C., whereby an alumina wiring board having the length of 56 mm, width of 80 mm, and thickness of 250 μm was obtained.

A ground layer 15 was formed on the main surface of the alumina wiring board and a power source layer 12 was formed on the back surface of the same. Here, on the assumption that an area A connected to a digitally operating electronic component was formed at the center of the board and an area B connected to an input/output terminal was formed above and below the area A, a high impedance strip C was formed at the top and bottom of the area A. In the high impedance strip C, the high resistance strip C1 was formed in spirals. A constant width of 3 mm was given as the strip width of the high resistance strip C1 in the high impedance strip C. Samples #1 through #11 were obtained in the above manner.

In Sample #1, both the ground layer 15 and power source layer 12 were formed out of Cu paste by means of print coating without forming the high impedance strip, and baked at 900° C.

Figure 16C:
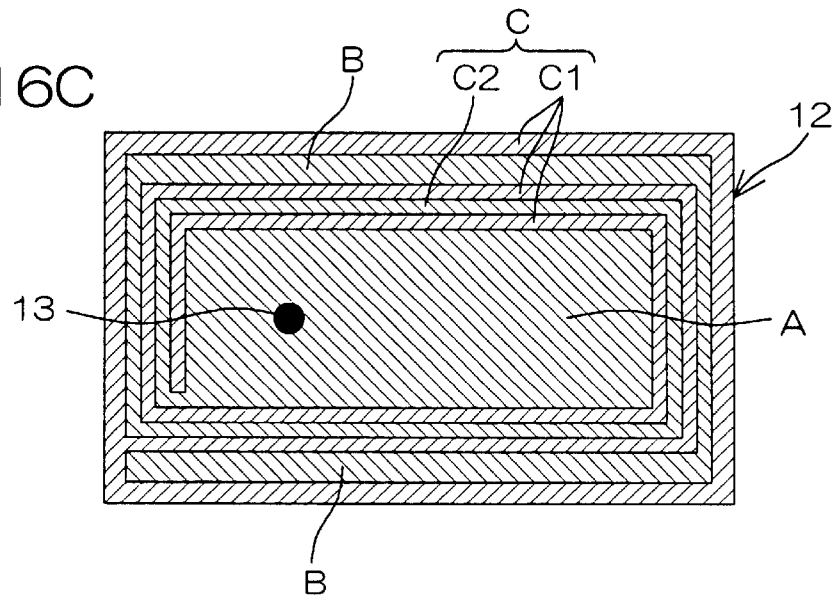
FIG. 16C is a rear elevation showing an arrangement of the evaluation wiring board according to the example of the present invention.

In Samples #2 through #11, the areas A and B, and the low resistance strip C2 in the high impedance strip C were formed out of Cu paste by means of print coating in accordance with the pattern shown in FIG. 16C, and baked at 900° C. Here, in the ground layer 15, the print coating was omitted at and around the power source terminal 14 connected to the via conductor 13 as shown in FIG. 16A, and the ground layer 15 was baked at 900° C. Subsequently, resistor paste containing Cu—Ni, $LaB_6$, or $SnO_2$ was printed on the power source layer 12 in such a manner that the pattern of the high resistance strip C1 shown in FIG. 16C overlaps the low resistance strip C2, and the layer was baked at 900° C., whereby the high resistance strip C1 was formed.

In Sample #10, the high impedance strip was formed in the same pattern in both the power source layer (D) and ground layer (G), and in Sample #11, the high impedance strip was formed in the ground layer (G) alone and the power source layer was provided with the conductor (Cu) pattern alone.

Then, the central axis 17a of a coaxial cable 17 was fixedly connected to the power source terminal 14 by solder 19, which was provided at the excitation point in each wiring board obtained in the above manner. Also, a ground tube 17b of the coaxial cable was fixedly connected to a ground terminal 16 provided inside the ground layer 15 by the solder 19.

A sine wave of 30 MHz to 1000 MHz was inputted from the coaxial cable to each wiring board thus manufactured, and a largest potential difference in a frequency range from 30 MHz to 1000 MHz was measured by bringing a high impedance measuring probe into contact with the area B of the ground layer 15 at a position where variance of voltage reached its maximum. Then, a ratio of the largest potential difference in each wiring board on a base of 1 with reference to the largest potential difference in Sample #1 having no high impedance strip was measured and the result is set forth in Table 3 below.

TABLE 3

| # | Material | High Resistance Strip Formed Portion | Sheet Resistance ($\Omega/\square$) | Largest Potential Difference Ratio |
|---|---|---|---|---|
| *1 | Cu | — | $3 \times 10^{-3}$ | 1.00 |
| 2 | Cu—Ni | D | $4 \times 10^{-2}$ | 0.72 |
| 3 | Cu—Ni | D | $1 \times 10^{-1}$ | 0.46 |
| 4 | Cu—Ni | D | $8 \times 10^{-1}$ | 0.26 |
| 5 | $LaB_6$ | D | $1 \times 10^{1}$ | 0.19 |
| 6 | $LaB_6$ | D | $1 \times 10^{2}$ | 0.22 |
| 7 | $LaB_6$ | D | $1 \times 10^{3}$ | 0.44 |
| 8 | $LaB_6$ | D | $1 \times 10^{4}$ | 0.89 |
| 9 | $SnO_2$ | D | $1 \times 10^{5}$ | 0.98 |
| 10 | $LaB_6$ | D, G | $1 \times 10^{1}$ | 0.17 |
| 11 | $LaB_6$ | G | $1 \times 10^{2}$ | 0.31 |

*: comparative example
D: power source layer
G: ground layer
Sheet resistance in low resistance strip (Cu): $3 \times 10^{-3}$ $\Omega/\square$ In comparison with Sample #1, in which the high impedance strip was not formed, a ratio of the largest potential difference was lessened in Samples #2 through #11, in which the high impedance strip was formed. In particular, a ratio of the largest potential difference was maintained as low as 0.5 or less with the wiring boards of Samples #3 through #7, and Samples and #11, in which the high resistance strip in the high impedance strip had a sheet resistance ranging from 0.1 $\Omega/\square$ to 1000 $\Omega/\square$.

What is claimed is:

1. A wiring board, on which an electronic component is mounted, comprising:

a dielectric substrate;

a wiring circuit layer formed on a main surface and/or a back surface of said dielectric substrate;

a power source layer formed on a main surface and/or a back surface of said dielectric substrate, and/or within said dielectric substrate;

a ground layer formed on the main surface and/or back surface of said dielectric substrate, and/or within said dielectric substrate; and a first connector for electrically connecting said electronic component and power source layer, and a second connector for electrically connecting said electronic component and ground layer, said wiring board being characterized in that:

either or both of said power source layer and ground layer have a low resistance area having a low sheet resistance, and a high resistance area having a high sheet resistance;

said high resistance area is provided at a circumference of said low resistance area; and said first connector and said second conductor are each connected to said low resistance area.

2. The wiring board according to claim 1, wherein said low resistance area is made of a conductor material principally composed of at least one kind of element selected from Cu, W, and Mo.

3. The wiring board according to claim 1, wherein said high resistance area is made of a conductor material having a higher resistance than a resistance in said low resistance area.

4. The wiring board according to claim 1, wherein the sheet resistance in said high resistance area is in a range from $0.1\ \Omega/\square$ to $1000\ \Omega/\square$.

5. The wiring board according to claim 1, wherein said high resistance area is provided with a plurality of pores or grooves to achieve the high sheet resistance.

6. A wiring board, on which an electronic component is mounted, comprising:

a dielectric substrate;

a wiring circuit layer formed on a main surface and/or a back surface of said dielectric substrate;

a power source layer formed on a main surface and/or a back surface of said dielectric substrate, and/or within said dielectric substrate;

a ground layer formed on the main surface and/or back surface of said dielectric substrate, and/or within said dielectric substrate; and a first connector for electrically connecting said electronic component and power source layer, and a second connector for electrically connecting said electronic component and ground layer, said wiring board being characterized in that:

either or both of said power source layer and ground layer have a high conductivity area having a high conductivity, and a low conductivity area having a low conductivity;

said low conductivity area is provided at a circumference of said high conductivity area; and said first connector and said second conductor are each connected to said high conductivity area.

7. The wiring board according to claim 6, wherein said high conductivity area is made of a conductor material principally composed of at least one kind of element selected from Cu, W, and Mo.

8. The wiring board according to claim 6, wherein said low conductivity area is made of a conductor material having a lower conductivity than a conductivity in said high conductivity area.

9. The wiring board according to claim 6, wherein the conductivity in said low conductivity area is in a range from $70\ \Omega^{-1}\cdot m^{-1}$ to $5\times 10^6\ \Omega^{-1}\cdot m^{-1}$.

10. The wiring board according to claim 6, wherein said low conductivity area is provided with a plurality of pores or grooves to achieve the low conductivity.

11. The wiring board according to claim 6, wherein a roughness on an interface between said low conductivity area and dielectric substrate is two or more times as great as a skin depth at a highest frequency of a signal transmitted to said wiring board.

12. A wiring board, on which an electronic component is mounted, comprising:

a dielectric substrate;

a wiring circuit layer formed on a main surface and/or a back surface of said dielectric substrate;

a power source layer formed on a main surface and/or a back surface of said dielectric substrate, and/or within said dielectric substrate;

a ground layer formed on the main surface and/or back surface of said dielectric substrate, and/or within said dielectric substrate; and a first connector for electrically connecting said electronic component and power source layer, and a second connector for electrically connecting said electronic component and ground layer, said wiring board being characterized in that:

either or both of said power source layer and ground layer are separated into a first area and a second area by a high impedance strip; and said first area includes a first connection to said first connector and a second connection to said second connector.

13. The wiring board according to claim 12, wherein said electronic component operates digitally.

14. The wiring board according to claim 12, wherein said high impedance strip is composed of a high resistance strip and a low resistance strip.

15. The wiring board according to claim 14, wherein said two areas separated by said high impedance strip are connected to each other through said low resistance strip to allow a direct current to pass through.

16. The wiring board according to claim 14, wherein said high resistance strip is shaped comb-wise or in spirals.

17. The wiring board according to claim 14, wherein said low resistance strip is shaped in meanders or spirals.

18. The wiring board according to claim 14, wherein a sheet resistance value of said high resistance strip is in a range from $0.01\ \Omega/\square$ to $10000\ \Omega/\square$.

19. The wiring board according to claim 14, wherein said high resistance strip is made of a resistor material principally composed of at least one of $SnO_2$ and $LaB_6$, or a conductor material composed of at least one kind of conductor selected from Cu, W, and Mo with a content of at least one kind of element selected from Re, Ru, and a dielectric material.

20. The wiring board according to claim 12, wherein said power source layer and/or ground layer are made of a conductor material principally composed of at least one kind of element selected from Cu, W, and Mo.

21. The wiring board according to claim 12, wherein an analog circuit is connected to said second area.

22. The wiring board according to claim 21, wherein an input/output terminal portion is connected to said second area.

23. The wiring board according to claim 12, wherein a high frequency circuit is connected to either of said first area and second area, and a low frequency circuit is connected to the other.

* * * * *